(12) United States Patent
Terada

(10) Patent No.: US 6,498,750 B2
(45) Date of Patent: Dec. 24, 2002

(54) BOOT BLOCK FLASH MEMORY CONTROL CIRCUIT; IC MEMORY CARD AND SEMICONDUCTOR MEMORY DEVICE INCORPORATING THE SAME; AND ERASURE METHOD FOR BOOT BLOCK FLASH MEMORY

(75) Inventor: Keiji Terada, Tenri (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/871,300

(22) Filed: May 30, 2001

(65) Prior Publication Data

US 2002/0021595 A1 Feb. 21, 2002

(30) Foreign Application Priority Data

May 30, 2000 (JP) .......................................... 2000-161258

(51) Int. Cl.[7] .............................................. G11C 16/04
(52) U.S. Cl. .............................. 365/185.11; 365/185.33; 365/218
(58) Field of Search ....................... 365/185.11, 185.33, 365/218, 230.03, 230.06, 231, 241

(56) References Cited

U.S. PATENT DOCUMENTS 5,402,383 A * 3/1995 Akaogi ................... 365/185.12
5,805,510 A   9/1998 Miyakawa et al. .... 365/185.11
6,031,757 A * 2/2000 Chuang et al. ........ 365/185.04
6,330,634 B1 * 11/2001 Fuse et al. .................. 711/103

FOREIGN PATENT DOCUMENTS

| EP | 0 592 069 B1 | 9/1998 |
| JP | 6-119230 | 4/1994 |
| JP | 10-241377 | 9/1998 |

* cited by examiner

*Primary Examiner*—David Nelms
*Assistant Examiner*—Thong Le
(74) *Attorney, Agent, or Firm*—Morrison & Foerster LLP

(57) ABSTRACT

There is provided a boot block flash memory control circuit for controlling a boot block flash memory, the boot block flash memory including at least one symmetrical block each having a first capacity and a plurality of asymmetrical blocks each having a capacity smaller than the first capacity. The boot block flash memory control circuit detects a first address signal designating an address in the boot block flash memory and a first command signal for causing the boot block flash memory to operate, and based on the detected first address signal and first command signal, outputs a second command signal and a second address signal for erasing data stored in one of the at least the one symmetrical block or a subset of the plurality of asymmetrical blocks.

12 Claims, 12 Drawing Sheets

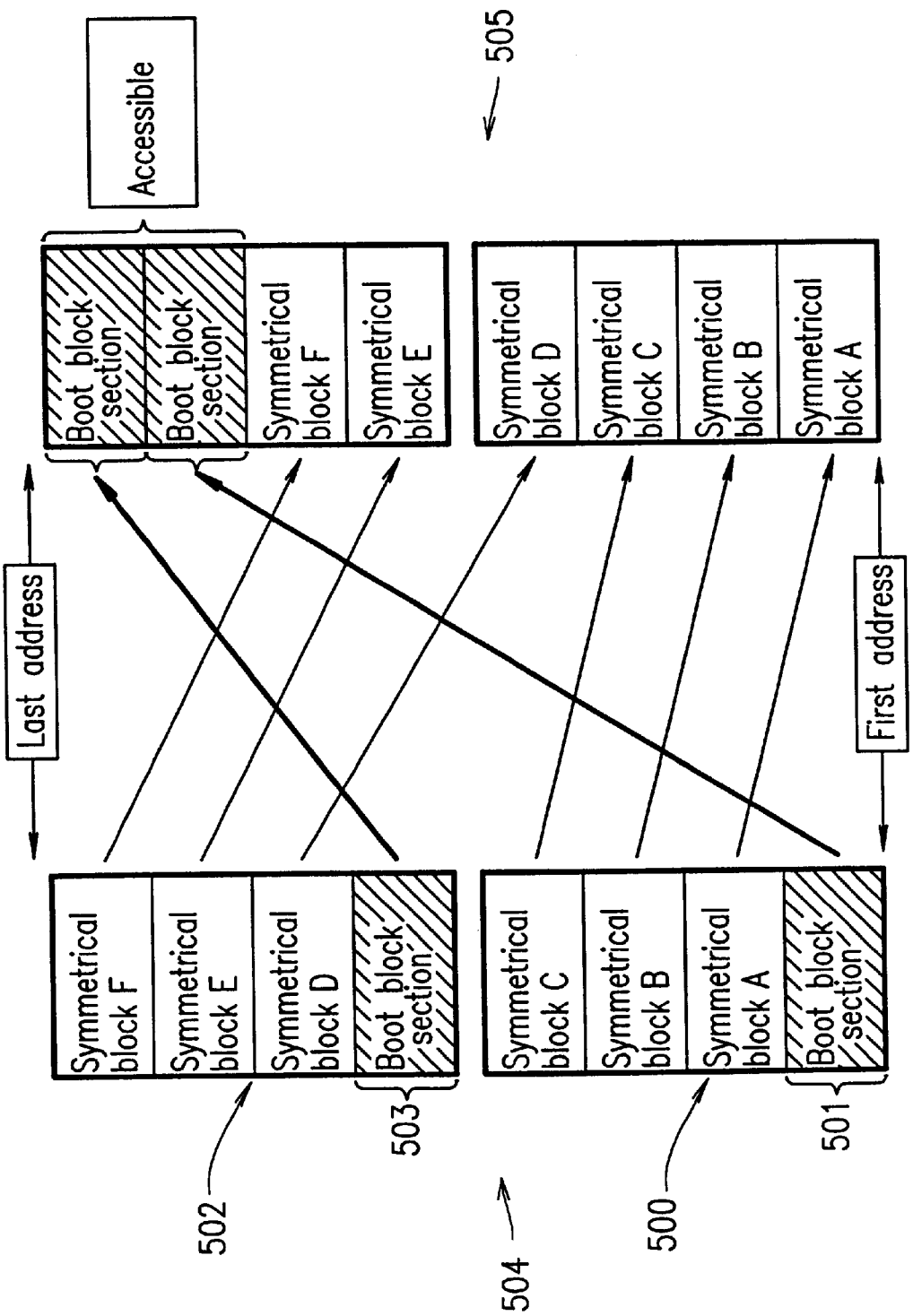

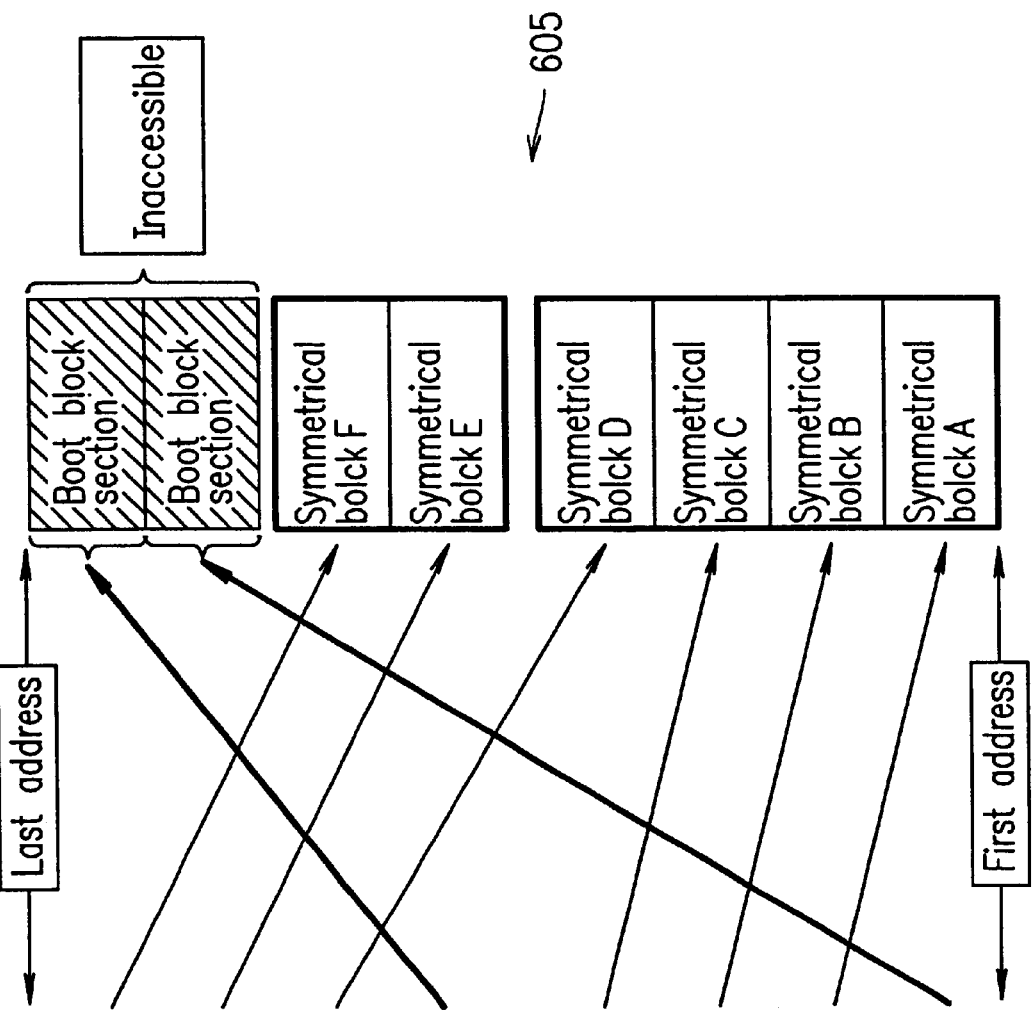

FIG.12A Symmetrical block flash memory

| | |
|---|---|
| 64kbytes (block 3) | |
| 64kbytes (block 2) | |
| 64kbytes (block 1) | |
| 64kbytes (block 0) | |

Company A's product /Company B's product

FIG.12B Boot block flash memory

| | |
|---|---|
| 64kbytes (block 10) | 30000h |
| 64kbytes (block 9) | 20000h |
| 64kbytes (block 8) | |
| 8kbytes (block 7) | 10000h |
| 8kbytes (block 6) | 0E000h |
| 8kbytes (block 5) | 0C000h |
| 8kbytes (block 4) | 0A000h |
| 8kbytes (block 3) | 08000h |
| 8kbytes (block 2) | 06000h |
| 8kbytes (block 1) | 04000h |
| 8kbytes (block 0) | 02000h |
| | 00000h |

Company A's product

≠

| |
|---|
| 64kbytes (block 6) |
| 64kbytes (block 5) |
| 64kbytes (block 4) |
| 8kbytes (block 3) |
| 8kbytes (block 2) |
| 8kbytes (block 1) |
| 16kbytes (block 0) |

Company B's product

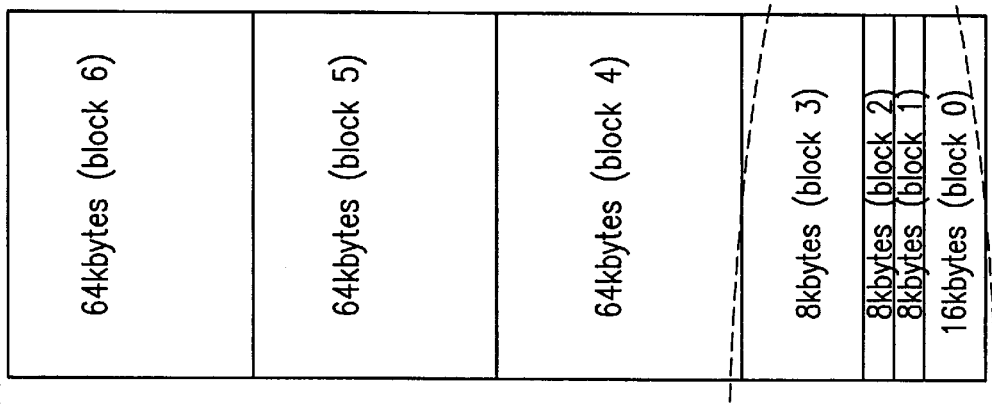
FIG.13B  Boot block mode
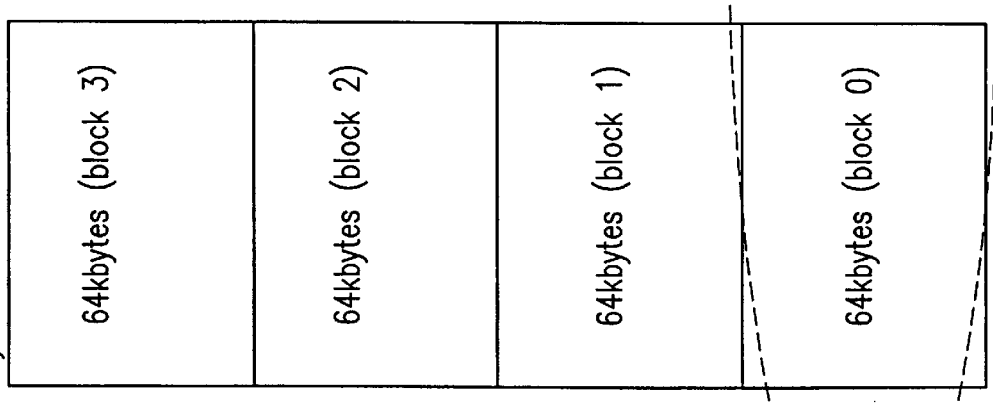
FIG.13A  Symmetrical block mode

BOOT BLOCK FLASH MEMORY CONTROL CIRCUIT; IC MEMORY CARD AND SEMICONDUCTOR MEMORY DEVICE INCORPORATING THE SAME; AND ERASURE METHOD FOR BOOT BLOCK FLASH MEMORY

BACKGROUND OF THE INVENTION

1. Field of the Invention

The present invention relates to a semiconductor memory device (e.g., an IC memory card) utilizing a boot block flash memory; a boot block flash memory control circuit used for such a semiconductor memory device; and an erasure method for a boot block flash memory.

2. Description of the Related Art

Flash memories can be classified into symmetrical block flash memories and boot block flash memories. A symmetrical block memory includes "symmetrical blocks", i.e., blocks having the same capacity. A boot block flash memory includes both symmetrical blocks and boot blocks, such that each boot block has a different capacity from that of each symmetrical block. Conventionally, a majority of flash memory-based IC memory cards, as shown in FIG. 12A, adopt a symmetrical block flash memory structure having symmetrical blocks of e.g., 64 kbytes. Therefore, conventional IC memory card applications often incorporate card controlling software intended for such IC memory cards of a symmetrical block flash memory type. Such card controlling software is not intended for IC memory cards of a boot block flash memory type.

Accordingly, there is a problem in that a majority of IC memory card applications on the market, whose card controlling software cannot be updated, can only utilize IC memory cards of a symmetrical block flash memory type.

Furthermore, an IC memory card of a boot block flash memory type as shown in FIG. 12B, may have a different boot block size (capacity) from manufacturer to manufacturer. Therefore, each IC memory card product requires a specially-designed data rewriting program. This requirement detracts from their versatility.

Hence, in order for IC memory cards to be versatile, they need to utilize symmetrical block flash memories. Thus, IC memory cards of a symmetrical block flash memory type may be versatilely used with respect to IC memory card applications which are adapted thereto; however, there still remains a problem with IC memory cards of a boot block flash memory type, in that such IC memory cards cannot be versatilely used.

Accordingly, a semiconductor memory device is proposed in Japanese Laid-Open Publication No. 6-119230, for example, in which a boot block mode and a symmetrical block mode are switchable so that either a symmetrical block flash memory portion or a boot block flash memory portion thereof can be used at a time, as shown in FIGS. 13A and 13B.

However, the technique disclosed in Japanese Laid-Open Publication No. 6-119230 requires both a boot block memory and a symmetrical block memory to be provided on a chip, resulting in the problem of increased chip area and hence increased cost.

On the other hand, Japanese Laid-Open Publication No. 10-241377 discloses a semiconductor memory device featuring a boot block flash memory in which the same address counter is used for designating cells in both symmetrical blocks and irregular blocks (i.e., boot blocks), thereby attempting to reduce the scale of the circuitry.

However, when performing a block erasure, the technique disclosed in Japanese Laid-Open Publication No. 10-241377 cannot change the size of the block to be erased; i.e., the boot blocks cannot be operated in the same fashion as symmetrical blocks. As a result, this boot block flash memory is not interchangeable with a symmetrical block flash memory. Another problem associated with conventional IC memory cards is that, when erasing data in a plurality of boot blocks in an IC memory card of a boot flash memory type, a host system must designate individual ones of the plurality of boot blocks, and it is necessary to issue plural instances of an erase command.

SUMMARY OF THE INVENTION

According to one aspect of the present invention, there is provided a boot block flash memory control circuit for controlling a boot block flash memory, the boot block flash memory including at least one symmetrical block each having a first capacity and a plurality of asymmetrical blocks each having a capacity smaller than the first capacity, wherein: the boot block flash memory control circuit detects a first address signal designating an address in the boot block flash memory and a first command signal for causing the boot block flash memory to operate, and based on the detected first address signal and first command signal, outputs a second command signal and a second address signal for erasing data stored in one of the at least the one symmetrical block or a subset of the plurality of asymmetrical blocks.

In one embodiment of the invention, a total capacity of the subset of asymmetrical blocks is equal to the first capacity of the at least one symmetrical block.

In another embodiment of the invention, while data stored in the subset of asymmetrical blocks is erased, a READY signal and an operation status signal, which are similar to a READY signal and an operation status signal to be output when data stored in one of the at least one symmetrical block is erased, are output.

In still another embodiment of the invention, the boot block flash memory control circuit further includes: a boot block address detection circuit for detecting a first block designating address signal which designates the subset of asymmetrical blocks and outputting a first signal based on the first block designating address signal; a command detection circuit for outputting a second signal based on the first signal, a first block erase command signal for erasing data stored in the subset of asymmetrical blocks, and a first control signal; and an address/command generation circuit for outputting the second address signal and the second command signal to the subset of asymmetrical blocks based on the second signal and a second control signal from the boot block flash memory.

In still another embodiment of the invention, the boot block flash memory control circuit further includes a READY signal/status signal control circuit for outputting a signal indicating an erasure state while the subset of asymmetrical blocks are erased.

In still another embodiment of the invention, at least one of the plurality of asymmetrical blocks includes a boot block or a parameter block.

According to another aspect of the present invention, there is provided an IC memory card including: a boot block flash memory; and an interface IC for controlling the boot block flash memory based on an external signal, wherein the interface IC includes the aforementioned boot block flash memory control circuit.

In one embodiment of the invention, in a memory space of the boot block flash memory, a plurality of asymmetrical blocks in the boot block flash memory are decoded to an address region which is substantially unlikely to be accessed.

In another embodiment of the invention, in a memory space of the boot block flash memory, a plurality of asymmetrical blocks in the boot block flash memory are decoded so as to be deleted from the memory space.

According to yet another aspect of the present invention, there is provided a semiconductor memory device including: a host system; a boot block flash memory; and a boot block flash memory control circuit for controlling the flash memory based on a signal from the host system, wherein the boot block flash memory control circuit is the aforementioned boot block flash memory control circuit.

According to yet another aspect of the present invention, there is provided a method for erasing data stored in a boot block flash memory including a plurality of asymmetrical blocks, including the steps of: outputting a first signal based on a first block designating address signal which indicates a block designating address of a subset of the plurality of asymmetrical blocks input from the host system; outputting a second signal based on the first signal, a first block erase command signal, and a first control signal; outputting a second block designating address signal and a second block erase command signal to the boot block flash memory, based on the second signal and a second control signal from the boot block flash memory; and outputting to the host system a signal indicating an erasure state of the boot block flash memory while erasing data stored in a subset of a plurality of asymmetrical blocks in the boot block flash memory.

In one embodiment of the invention, the plurality of asymmetrical blocks are decoded in such a manner that erasure of data stored in the plurality of asymmetrical blocks is prohibited irrespective of the first block designating address signal which is input from the host system.

Hereinafter, the effects of the present invention will be described.

According to the present invention, in order to make it possible to utilize a boot block flash memory in the same manner as a symmetrical block flash memory, a boot block flash memory control circuit is provided in an interface portion of a boot block flash memory. When a first erase command signal and a first address signal are issued from a host system, the boot block flash memory control circuit can detect that the address signal designates a subset of a plurality of asymmetrical blocks. Then, the boot block flash memory control circuit outputs a second address signal and a second erase command signal for performing a data erasure for the subset of asymmetrical blocks. As a result, as described in Example 1 below, the data stored in the subset of asymmetrical blocks can be erased by only a single instance of a first erase command signal issued from a host system. The host system is not required to issue a plurality of instances of the first block erase command signal while switching the first block designating address signal, unlike in conventional systems. Moreover, the host system can deal with a subset of a plurality of asymmetrical blocks as if one virtual block.

According to the present invention, it is preferable to perform a data erasure for a number of asymmetrical blocks so that the combined capacity of such asymmetrical blocks becomes equal to the capacity of each symmetrical block present in the boot block flash memory. As a result, as described in Example 2 below, the size of the blocks to be erased can be unified, so that operations on an IC memory card including boot blocks can properly take place by employing a host system containing software which is designed for IC memory cards of a symmetrical block flash memory type. In this case, the asymmetrical blocks within such a group of combined asymmetrical blocks can be erased in a sequential manner.

Furthermore, according to the present invention, all of asymmetrical blocks in a boot block flash memory may be decoded to address regions within a memory space which are least likely to be accessed by a host system. In this case, as described in Example 3 below, all asymmetrical blocks can be concentrated in regions within the memory space of the IC memory card which are least likely to be accessed by a host system, but the host system can still access the boot blocks. When a user uses an IC memory card, there is a general tendency that the memory space is accessed beginning from the first address. Therefore, by ensuring that the asymmetrical blocks are decoded to the vicinity of the last address in the memory space, the probability of the asymmetrical blocks being made any use of is advantageously minimized.

On the other hand, the block erase time required for a symmetrical block is four times as long as the block erase time required for a virtual symmetrical block (in which asymmetrical blocks are sequentially erased). By placing the asymmetrical blocks in the vicinity of the last address, which is less likely to be accessed, any deterioration in performance which would otherwise occur can be prevented.

Alternatively, according to the present invention, an asymmetrical block section may be decoded so as to be deleted from the memory space (hereinafter such decoding will be referred to as a "deletion-decode"), so that a host system cannot access the asymmetrical blocks in a boot block flash memory corresponding to addresses which are input from the host system. In this case, as described in Example 4 below, the asymmetrical blocks are deleted from the memory space of the IC memory card, so that the host system is prevented from accessing the boot block section.

As described above, the block erase time required for a symmetrical block is four times as long as the block erase time required for a virtual symmetrical block (in which asymmetrical blocks are sequentially erased). Therefore, card controlling software which is designed for IC memory cards of a symmetrical block flash memory type may run the risk of overflowing a wait time which is associated with an erase time for a particular IC memory card. Accordingly, an IC memory card can be constructed which has a memory space only including symmetrical blocks and no asymmetrical block sections, whereby operations can occur satisfactorily.

Furthermore, according to the present invention, while a subset of a plurality of asymmetrical blocks are being subjected to a data erasure, a READY signal and an operation status signal similar to those used while a host system is performing a data erasure for a symmetrical block may be output to the host system. As a result, as described in Example 5 below, the data erasure for the subset of asymmetrical blocks appears to the host system as if an erase operation for a single symmetrical block.

Thus, the invention described herein makes possible the advantages of: (1) providing a boot block flash memory control circuit which, with an erase command signal for erasing data in one symmetrical block of a boot block flash memory, is capable of erasing data in a plurality of asymmetrical blocks, and which can avoid increase in the chip area of a single flash memory structure; an IC memory card and a semiconductor memory device incorporating such a boot block flash memory control circuit; and an erasure method for the boot block flash memory, and (2) providing a boot block flash memory control circuit which allows a plurality of asymmetrical blocks to be operated as symmetrical blocks, and which allows IC memory cards to be versatilely used with conventional IC memory card applications in the same fashion as a symmetrical block flash memory; an IC memory card and a semiconductor memory device incorporating such a boot block flash memory control circuit; and an erasure method for the boot block flash memory.

These and other advantages of the present invention will become apparent to those skilled in the art upon reading and understanding the following detailed description with reference to the accompanying figures.

BRIEF DESCRIPTION OF THE DRAWINGS

FIGS. 7A and 7B are diagrams illustrating a semiconductor memory device according to Example 3 of the present invention.

FIGS. 8A and 8B are diagrams illustrating a semiconductor memory device according to Example 4 of the present invention.

FIGS. 12A and 12B are diagrams illustrating exemplary structures of flash memories to be mounted on an IC memory card.

FIGS. 13A and 13B are diagrams illustrating conventional flash memories.

DESCRIPTION OF THE PREFERRED EMBODIMENTS

Hereinafter, the present invention will be described by way of illustrative examples, with reference to the accompanying figures.

In general, an operation for a flash memory is performed based on an address signal and command signal which are input to the flash memory. The address signal designates an address of the flash memory. The command signal designates a data read operation, a data write operation, or a data erase operation.

In a flash memory, a data read operation and a data write operation are performed on a cell-by-cell basis, (assuming that a block is composed of cells). On the other hand, a data erase operation is performed for each entire block. Therefore, when an erase signal is input to a flash memory as a command signal, the associated address signal represents a block to be erased. In the present invention, such an address signal is referred to as a "block designating address signal".

According to the present invention, in a boot block flash memory including at least one symmetrical block and a plurality of asymmetrical blocks, an erase command signal for erasing the data stored in one symmetrical block can be used for erasing the data stored in more than one asymmetrical block. In addition, an erase command signal which is input to a device incorporating a boot block flash memory (e.g. an IC memory card) can be virtually interpreted as always designating a constant block size or capacity to be erased, even though the erase command signal may actually be designating more than one block size or capacity to be erased.

Although the following description of examples of the present invention deals with boot blocks, the present invention is also applicable to parameter blocks. A product which is referred to as a "boot block flash memory" generally includes a number of blocks having a different capacity from that of the symmetrical blocks in the vicinity of the first address or the last address. Some of these blocks are referred to as "boot blocks", while the others are referred to as "parameter blocks", depending on the contents of a program stored in each type of block. For example, a boot program for starting up a CPU may be stored in the boot blocks, whereas setting information (parameters) for flash memory applications may be stored in the parameter blocks. In general, a boot block has a capacity equal to or less than that of a symmetrical block.

In the present specification, the term "asymmetrical block" means at least one of a boot block or a parameter block. In the present specification, a "boot block flash memory" means a flash memory including asymmetrical blocks.

EXAMPLE 1

Figure 1:
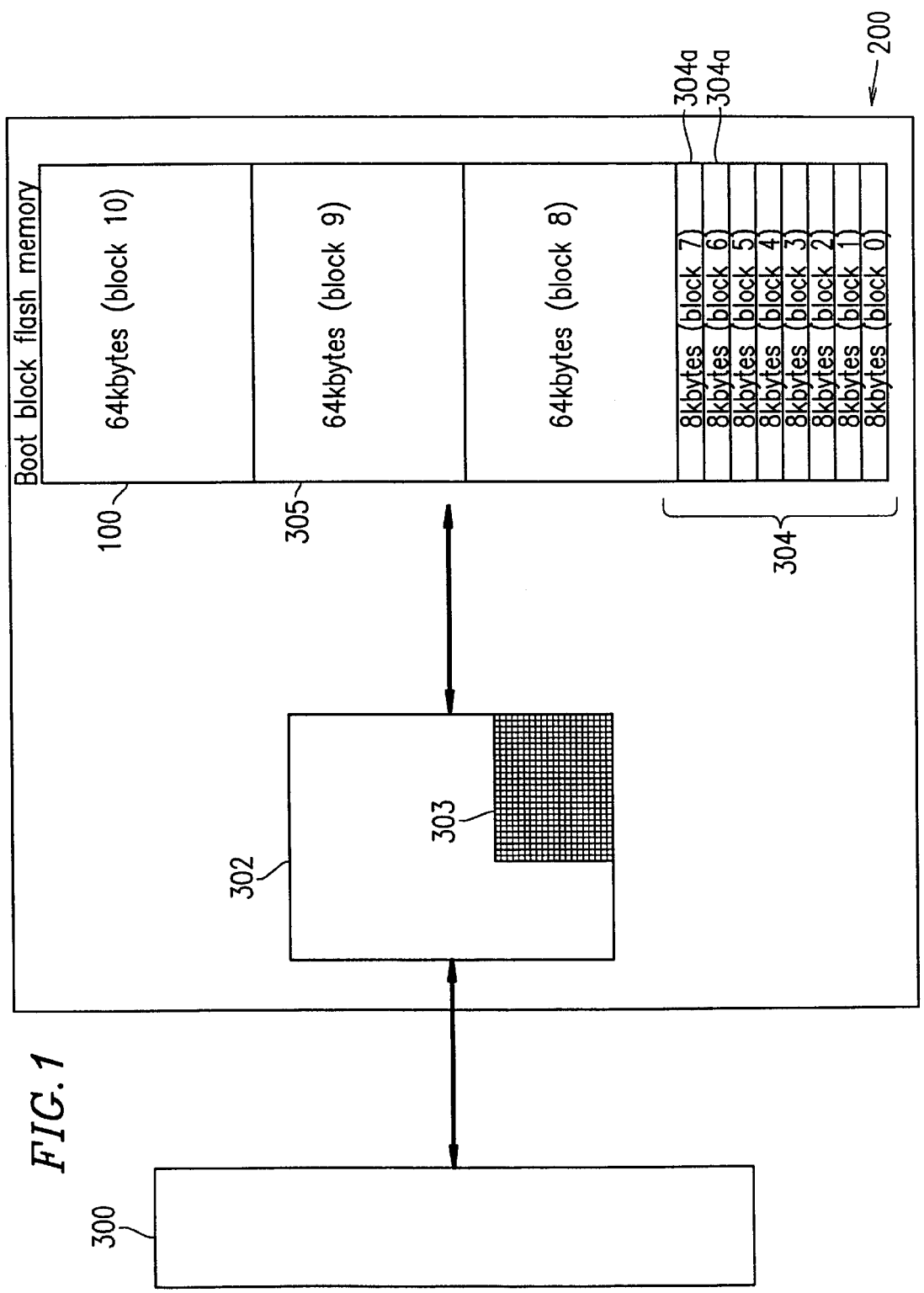
FIG. 1 is a block diagram illustrating a semiconductor memory device according to Example 1 of the present invention.

FIG. 1 is a block diagram illustrating a semiconductor memory device 200 according to Example 1 of the present invention. The semiconductor memory device 200 includes a host system 300 and an IC memory card 301. The IC memory card 301 includes an interface IC 302 and a boot block flash memory 100. The boot block flash memory 100 includes a plurality of blocks. The boot block flash memory 100 includes at least one boot block section 304, each boot block section 304 including a plurality of boot blocks 304a. The boot block flash memory 100 shown in FIG. 1 includes three symmetrical blocks 305 (i.e., blocks 8 to 10), each having a capacity of 64 kbytes. The boot block section 304 includes eight boot blocks 304a (i.e., blocks 0 to 7), each having a capacity of 8 kbytes. The entire boot block section 304 illustrated in FIG. 1 has a capacity of 64 kbytes, which is equal to the capacity of one symmetrical block 305. However, it is not a requirement under the present invention that the entire boot block section 304 has a capacity which is equal to the capacity of one symmetrical block 305.

The interface IC 302 includes a boot block flash memory control circuit 303.

In the following description, an address signal and a command signal which are input from the host system 300 to the IC memory card 301 (or more specifically, the boot block flash memory control circuit 303 within the interface IC 302) during a data erase operation are referred to as a "first block designating address signal" and a "first block erase command signal". Note that an erase operation for a flash memory is to be performed for each entire block.

According to the present invention, the boot block section 304 is designated by a first block designating address signal as a virtual block.

During a data erase operation according to the present invention, the first block designating address signal and the first block erase command signal are detected by the interface IC 302 (or more specifically, the boot block flash memory control circuit 303). Based on the detection results, another block designating address signal and another block erase command signal are generated, which are used for controlling the boot block flash memory 100. In the following description, the latter block designating address signal and block erase command signal, which are used for controlling the boot block flash memory 100, are referred to as a "second block designating address signal" and a "second block erase command signal", respectively. The second block designating address signal can designate any block within the boot block flash memory 100 (not only the symmetrical blocks 305 but also the boot blocks 304a).

The host system 300 outputs to the IC memory card 301 a first address signal for designating an address in the boot block flash memory 100 and a first command signal for causing an operation to be performed for the designated address (e.g., a write, erase, or read operation).

Hereinafter, a case will be illustrated in which the host system 300 instructs a data erase operation for the boot block flash memory 100 in the IC memory card 301. In this case, the first address signal designates a block to be erased. According to the terminology employed in the present specification, such a first address signal is referred to as a "first block designating address signal", and the associated first command signal referred to as a "first block erase command signal".

When a first block designating address signal designating the boot block section 304 and a first block erase command signal are input to the boot block flash memory control circuit 303 in the interface IC 302 from the host system 300, the boot block flash memory control circuit 303 sequentially erases the eight blocks (i.e., block 0 to block 7) in the block section 304. The operation of the boot block flash memory control circuit 303 will be described in more detail. The present specification illustrates the boot block flash memory control circuit 303 chiefly as a device for controlling the boot block section 304 during an erase operation. The operation of the symmetrical blocks 305 in the boot block flash memory 100 and any operation of the boot block section 304 other than erase operations can occur in accordance with the well-known technologies inherent in the interface circuit IC 302. Alternatively, the boot block flash memory control circuit 303 may be constructed so as to control the erase operation for all blocks in the boot block flash memory 100, or to control all types of operations for all blocks in the boot block flash memory 100, as described later.

Figure 2:
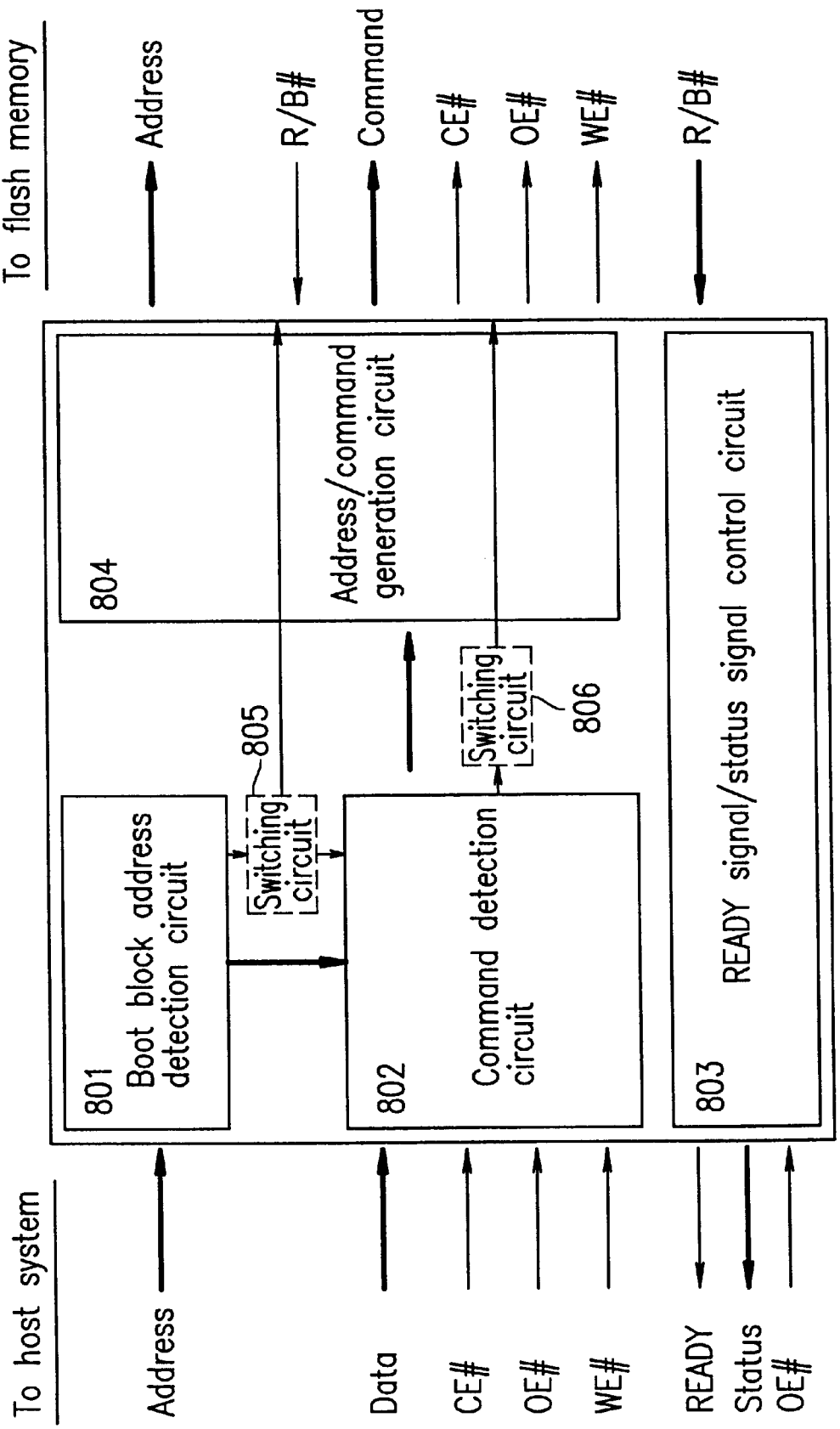
FIG. 2 is a block diagram illustrating a structure of a boot block flash memory control circuit according to an example of the present invention.

FIG. 2 is a block diagram illustrating a structure of the boot block flash memory control circuit 303 according to an example of the present invention. The boot block flash memory control circuit 303 includes: a boot block address detection circuit 801 for detecting the first address signal input from the host system 300; a command detection circuit 802 for detecting the first command signal input from the host system 300; an address/command generation circuit 804 for generating the second address signal and the second command signal for the boot block flash memory 100 based on the first address signal and first command signal; and a READY signal/status signal control circuit 803. The boot block flash memory control circuit 303 may further include a switching circuit 805 between the boot block address detection circuit 801 and the command detection circuit 802. The boot block flash memory control circuit 303 may further include a switching circuit 806 between the command detection circuit 802 and the address/command generation circuit 804.

When the boot block address detection circuit 801 detects a first block designating address signal designating the boot block section 304 input from the host system 300 and when the command detection circuit 802 detects a first block erase command signal, the address/command generation circuit 804 generates a second block designating address signal and a second block erase command signal for erasing the data stored in the boot block section 304. The READY signal/status signal control circuit 803 will be described later in detail with reference to Example 5.

Figure 3:
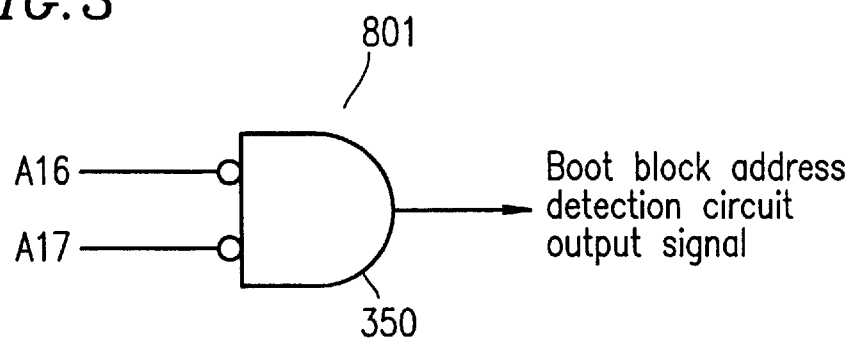
FIG. 3 is a block diagram illustrating an exemplary structure of a boot block address detection circuit in a boot block flash memory control circuit according to an example of the present invention.

FIG. 3 is a block diagram illustrating an exemplary structure of a boot block address detection circuit 801. In accordance with the boot block address detection circuit 801 shown in FIG. 3, first block designating address signals (shown at "A16" and "A17" in FIG. 3) which designate addresses A16 and A17 are inverted and input to an AND circuit 350. The output from the AND circuit 350 is output as an output signal from the boot block address detection circuit 801.

If addresses A17 and A16 designated by the first block designating address signal which is externally input to the IC memory card 301 are both "0", (hereinafter represented as "0, 0"), the boot block address detection circuit 801 is set so that block 0 (boot block) to block 7 (boot block) in the boot block section 304 are selected, as shown in Table 1 below. In this case, the output from the boot block address detection circuit 801 is at a High level (active). On the other hand, if addresses A17 and A16 designated by the first block designating address signal which is externally input to the IC memory card 301 are "0, 1", "1, 0" or "1, 1", the boot block address detection circuit 801 is set so that block 8 to block 10 in the symmetrical block 305 are respectively selected. In this case, the output from the boot block address detection circuit 801 is at a Low level (non-active), as shown in Table 1 below.

In Table 1, the block(s) to be designated by the first block designating address signal is represented by two addresses (A17, A16). This can be seen as a representation of four virtual blocks, i.e., three symmetrical blocks 305 and one boot block section 304 being present in the boot block flash memory 100 (FIG. 1). It will be appreciated by those skilled in the art that any number of addresses can be employed depending on the number of virtual blocks desired. In Table 1, addresses A15 to A13 are used for selecting one of the eight boot blocks 304a in the boot block section 304. However, the present invention is not limited to the illustrated address designation scheme. In Table 1, * represents an unspecified value which may be either "0" or "1".

TABLE 1

| A17 | A16 | A15 | A14 | A13 | A12–A0 | selected block |
|---|---|---|---|---|---|---|
| 1 | 1 | * | * | * | * | block 10 |
| 1 | 0 | * | * | * | * | block 9 |
| 0 | 1 | * | * | * | * | block 8 |
| 0 | 0 | 1 | 1 | 1 | * | block 7 |
| 0 | 0 | 1 | 1 | 0 | * | block 6 |
| 0 | 0 | 1 | 0 | 1 | * | block 5 |
| 0 | 0 | 1 | 0 | 0 | * | block 4 |
| 0 | 0 | 0 | 1 | 1 | * | block 3 |
| 0 | 0 | 0 | 1 | 0 | * | block 2 |
| 0 | 0 | 0 | 0 | 1 | * | block 1 |
| 0 | 0 | 0 | 0 | 0 | * | block 0 |

Figure 4:
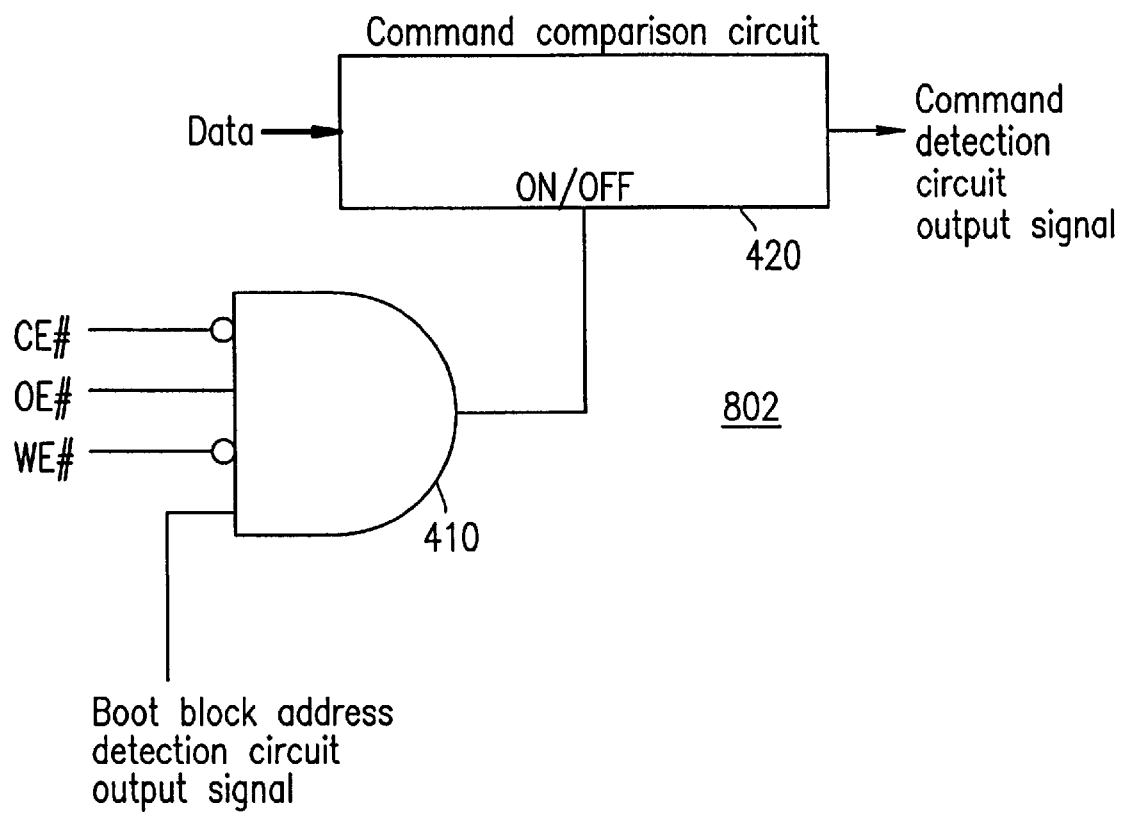
FIG. 4 is a block diagram illustrating an exemplary structure of a command detection circuit in a boot block flash memory control circuit according to an example of the present invention.

The output signal from the boot block address detection circuit 801 is input to the command detection circuit 802. FIG. 4 is a block diagram illustrating an exemplary structure of the command detection circuit 802. The command detection circuit 802 includes an AND circuit 410 and a command comparison circuit 420. As well as the output signal from the boot block address detection circuit 801, the AND circuit 410 receives the following control signals: CE# (a card enable signal), OE# (an output enable signal), and WE# (a write enable signal). When a data erase operation is performed to the boot block flash memory 100, the control signals CE#, OE#, and WE# input from the host system 300 to the AND circuit 410 are at a Low level, a High level, and a Low level, respectively.

The command comparison circuit 420 is activated when the output from the boot block address detection circuit 801 is at the High level (i.e., when boot block 0 to boot block 7 in the boot block section 304 are selected). The command comparison circuit 420 receives the data of the first block erase command signal, and compares the data with expected values ("20h" and "D0h") which are preset in the command comparison circuit 420. If the comparison result indicates that the data matches the expected values, i.e., the data of the block erase command signal indicates "20h" and "D0h", then the output signal from the command detection circuit 802 shifts to a High level. On the other hand, when the output signal from the boot block address detection circuit 801 is at the Low level, (i.e., when the first block designating address signal designates one of the three symmetrical blocks 305 (block 8 to block 10), or when the input first command signal does not instruct an erase operation to be performed, the output signal from the command detection circuit 802 shifts to a Low level.

Figure 5:
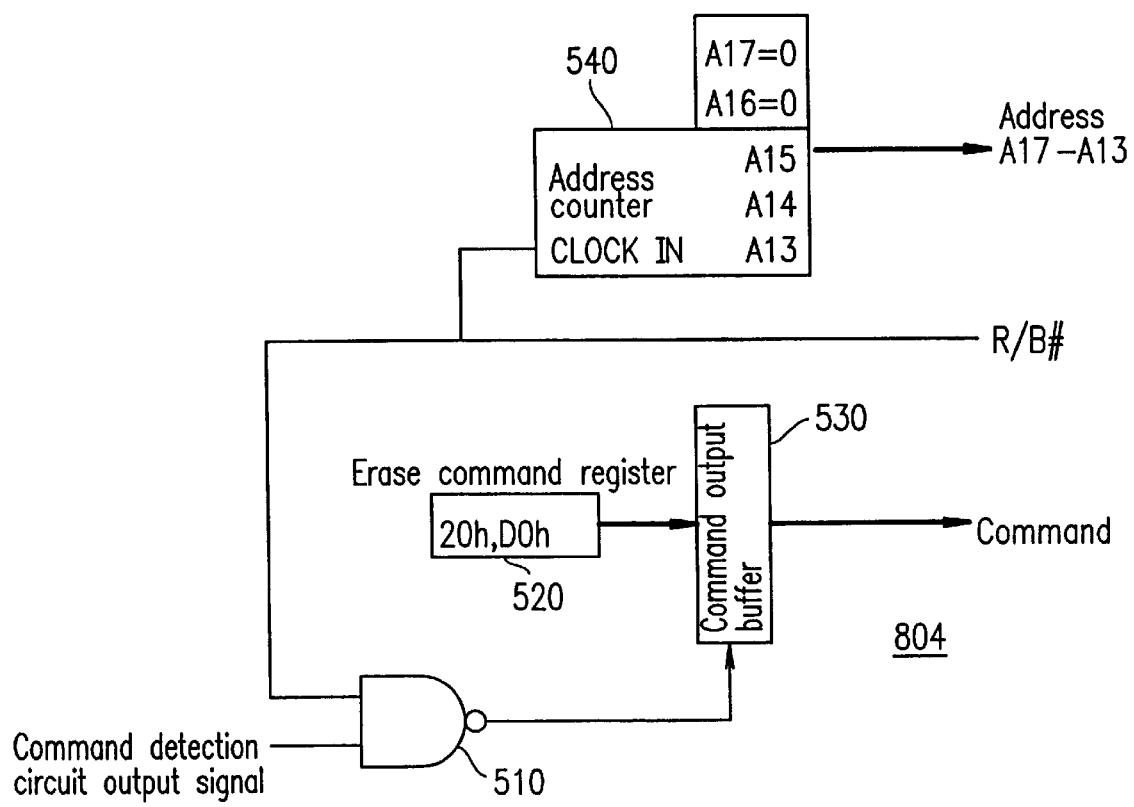
FIG. 5 is a block diagram illustrating an exemplary structure of address/command generation circuit in a boot block flash memory control circuit according to an example of the present invention.

The output signal from the command detection circuit 802 is input to the address/command generation circuit 804. FIG. 5 illustrates an exemplary structure of the address/command generation circuit 804. The address/command generation circuit 804 includes an AND circuit 510, an erase command register 520, a command output buffer 530, and an address counter 540.

The output signal from the command detection circuit 802 and the control signal R/B# from the boot block flash memory 100 are input to the AND circuit 510. If the control signal R/B# is at the High level, the boot block flash memory 100 is ready to accept a command. The output signal from the AND circuit 510 is inverted so as to be output to the command output buffer 530.

If the output signal from the command detection circuit 802 and the control signal R/B# which are input to the AND circuit 510 are both at the High level, the data "20h" and "D0h" stored in the erase command register 520 are output as a second block erase command signal to the boot block flash memory 100, via the command output buffer 530.

The control signal R/B# is also input to the address counter 540 as a clock signal therefor. According to the present example, based on addresses A15 to A13 (which are counted up based on the clock signal) and addresses A17 and A16 as designated by the first block designating address signal, the address counter 540 generates a second block designating address signal, which is output to the boot block flash memory 100.

Addresses A17 and A16 as designated by the first block designating address signal externally input to the IC memory card 301 and addresses A15 to A13 which are output from the address counter 540 in the address/command generation circuit 804 are both initially set at "0". When the second block designating address signal in which addresses A17 to A13 are designated as "00000" and the second block erase command signal are input to the boot block flash memory 100, an erase operation for block 0, as designated by the second block designating address signal "00000" (see Table 1) is first performed. While block 0 is being erased, the control signal R/B# from the boot block flash memory 100 is at the Low level, and the address/command generation circuit 804 does not output an erase command via the command output buffer 530.

Once the data erasure in block 0 is completed, the control signal R/B# from the boot block flash memory 100 shifts to the High level. As a result, the address counter 540 counts up so that addresses A17 to A13 indicate "00001". The second block designating address signal designating A17 to A13 as "00001" points to block 1 (see Table 1). At this time, since the address/command generation circuit 804 is outputting the second block erase command signal to the boot block flash memory 100 via the command output buffer 530, an erase operation for block 1, as selected by addresses A17 to A13 being "00001" (see Table 1), is performed.

A similar operation is also performed for block 2 to block 7. As a result, the eight blocks from block 0 to block 7 are sequentially erased.

In one variant of the present example, a switching circuit 805 may be inserted between the boot block address detection circuit 801 and the command detection circuit 802. In such a case, when the first block designating address signal designates addresses A16 and A17 to both be "0", with a first block erase command signal having data "20h" and "D0h" being externally input to the boot block flash memory control circuit 303, the output signal (High level) from the boot block address detection circuit 801 may control the switching circuit 805 so that the second block erase command signal from the address/command generation circuit 804 is input to the boot block flash memory 100. As a result, the data stored in the boot blocks 304a in the boot block section 304 is erased.

On the other hand, if either one of address A16 or A17 is not "0", the switching circuit 805 may allow the data "20h" and "D0h" of the externally-input first block erase command to be input to the boot block flash memory 100 as second block erase command data. As a result, the data in the symmetrical blocks 305 in the boot block flash memory 100 is erased.

By employing the switching circuit 805 in the aforementioned manner, the data to be erased may be a symmetrical block 305 (as opposed to the boot block section 304), and the second block erase command signal may still be output to the boot block flash memory 100. Thus, the boot block flash memory control circuit 303 can control all possible data erase operations that may occur on the boot block flash memory 100.

Similarly, by inserting the switching circuit 806 between the command detection circuit 802 and the address/command generation circuit 804, even if the first command signal is a signal instructing an operation other than a data erase (e.g., a read signal or a write signal), the boot block flash memory control circuit 303 can control all possible operations that may occur on the boot block flash memory 100.

As described above, in a boot block flash memory according to the present example of the invention, it is possible to erase the data stored in a plurality of asymmetrical blocks by using an erase command signal for erasing the data stored in one symmetrical block.

The present example of the invention also provides the following advantage: Conventionally, in order to erase an amount of data equal to the capacity of a boot block section (i.e., 64 kbytes=8 kbytes×8), the host system is required to issue a first block erase command signal eight times while switching the first block designating address signal. According to the present example of the invention, the host system 300 only needs to issue one instance of a first block erase command signal.

Moreover, the host system 300 according to the present invention can deal with the eight blocks (block 0 to block 7) in the IC memory card 301 as one virtual block. The present invention has no adverse effects on a read or write operation for the boot blocks because a read or write operation is performed on a cell-by-cell basis, as opposed to an erase operation which is performed for each entire block.

Although the above description illustrates the case where the total capacity of the boot blocks 304a is equal to the capacity of one symmetrical block 305, the present invention is not limited to such a construction. The present invention is applicable to the case where the sum of the capacity of some of the plurality of boot blocks is equal to the capacity of one symmetrical block 305.

EXAMPLE 2

Figure 6B:
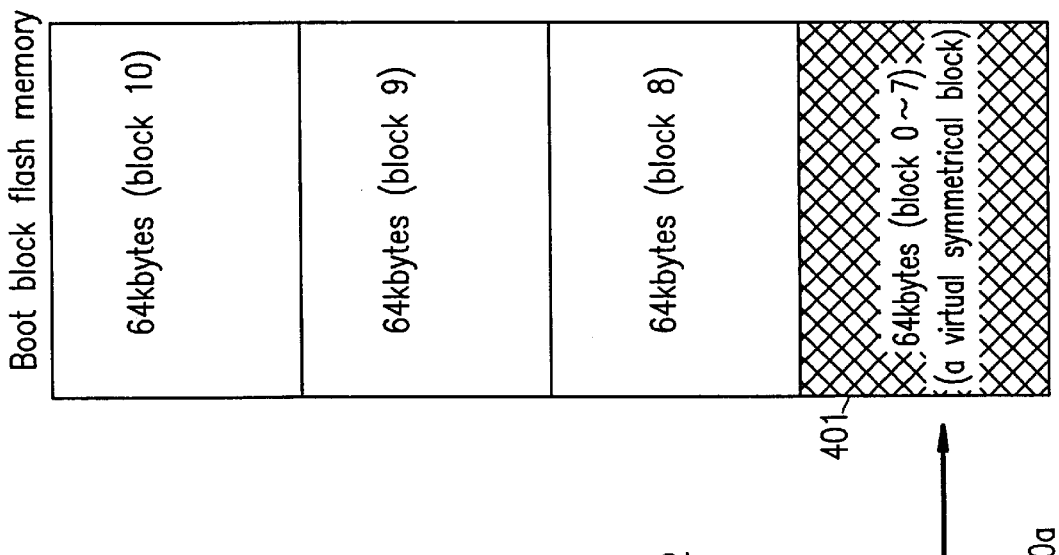
FIGS. 6A and 6B are diagrams illustrating a semiconductor memory device according to Example 2 of the present invention.
Figure 6A:
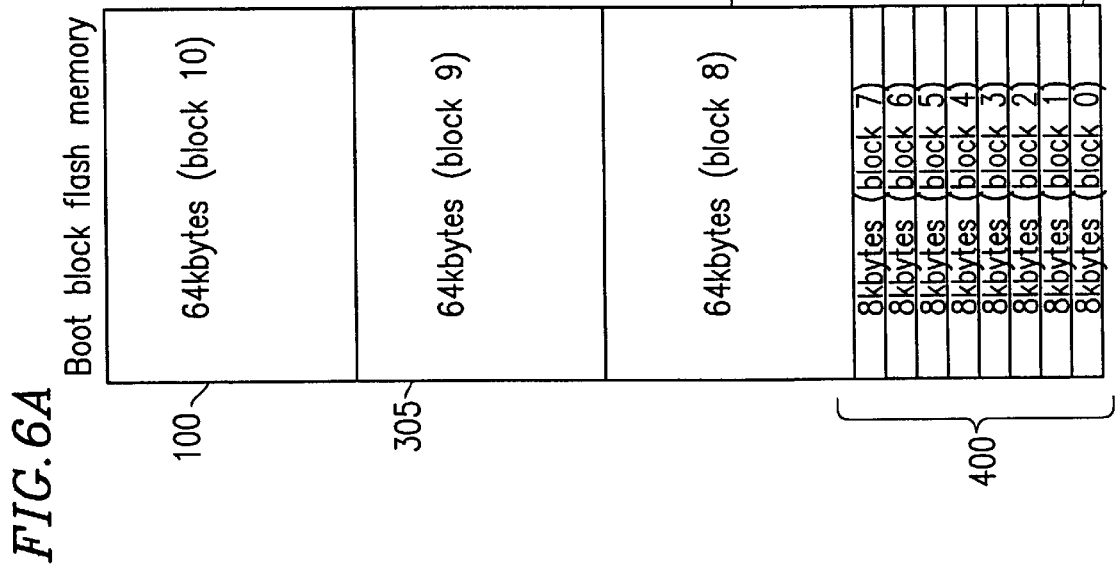

FIGS. 6A and 6B are diagrams illustrating a semiconductor memory device according to Example 2 of the present invention. According to the present example, the relationship between the capacity of the boot block section and the capacity of symmetrical blocks, which have been described in Example 1, will be described in more detail. The boot block flash memory control circuit 303 (FIG. 1) can be used to deal with the boot block section 400 shown in FIG. 6A, which includes 8 kbytes×8 boot blocks, as one virtual block (symmetrical block) 401 of 64 kbytes×1 block, as shown in FIG. 6B. Thus, the capacity of the boot block section 400 is equalized to the capacity of each symmetrical block in the boot block flash memory.

For example, the address/command generation circuit 804 shown in FIG. 5, the address counter 540 may be arranged so as to have a 3-bit output, whereby eight boot block addresses 400a can be designated.

In accordance with this structure, the boot block flash memory control circuit 303 makes it possible to designate both the boot block section 400 and the symmetrical blocks 402 (block 8 to block 10) with only addresses A16 and A17 which are designated by a first block designating address signal. Moreover, when an erase operation is performed for the boot block section 400, the data "20h" and "D0h" of an externally-input first block erase command signal are not directly input to the boot block flash memory. Rather, a second block erase command signal, which is generated by the address/command generation circuit 804 based on the data "20h" and "D0h" of the first block erase command signal, is input to the boot block flash memory. As a result, a user can use the IC memory card as if composed only of symmetrical blocks.

Furthermore, since the block size is uniformed to the same capacity (64 kbytes) as that of the symmetrical blocks, operations on the IC memory card can properly take place by employing a host system containing software which is designed for IC memory cards of a symmetrical block flash memory type.

EXAMPLE 3

FIGS. 7A and 7B each illustrates a memory space of an IC memory card as an example of a semiconductor memory device according to the present invention. More specifically, FIG. 7B shows a memory space 505 of an IC memory card according to Example 3 of the present invention; and FIG. 7A shows a memory space 504 of a comparative IC memory card. Although FIGS. 7A and 7B each illustrate the case where the IC memory card includes two boot block flash memories (or boot block sections), the present invention is not limited to such a configuration.

In FIG. 7A, the IC memory card includes a first boot block flash memory 500 and a second boot block flash memory 502. The first boot block flash memory 500 includes a boot block section 501 and symmetrical blocks A, B, and C. The second boot block flash memory 502 includes a boot block section 503 and symmetrical blocks D, E, and F. The memory space 504 of this comparative IC memory card, which includes the first and second boot block flash memories 500 and 502, is arranged so as to include the respective blocks or block sections in the following order, beginning from the first address: the boot block section 501; symmetrical blocks A, B, and C; the boot block section 503; and symmetrical blocks D, E, and F. Thus, it can be seen that the original arrangement of the actual boot block flash memories 500 and 502 is conserved in the memory space 504 shown in FIG. 7A.

In the memory space 505 of the IC memory card according to Example 3 shown in FIG. 7B, the blocks in the boot block flash memories 500 and 502 are arranged in a modified order: symmetrical blocks A, B, C, D, E, and F; and the boot block sections 501 and 503, beginning from the first address.

According to the present example, as shown in FIG. 7B, the addresses corresponding to the boot block sections 501 and 503 in the memory space 505 are arranged so as to be decoded to address regions which are unlikely to be accessed by a host system (i.e., regions away from the first address of the memory space) for the following reason. The block erase time required for a symmetrical block is four times as long as the block erase time required for a virtual symmetrical block (i.e., a boot block section). Since there is a general tendency that a memory space is accessed beginning from the first address, it is advantageous to place the slower virtual symmetrical blocks at address regions away from the first address, which are less likely to be accessed.

According to the present example, as shown in Table 2 below, the addresses in the memory space 505 are set so that the boot block section 501 and the boot block section 503 are mostly decoded to the last address within the memory space 505. A relationship between upper addresses input from a host system and decoded blocks according to the present example is shown in Table 2:

TABLE 2

| upper address input from the host system | Example 3 | Example 4 |
|---|---|---|
| 111 | boot block section 503 | not decoded |
| 110 | boot block section 501 | not decoded |
| 101 | symmetrical block F | symmetrical block F |
| 100 | symmetrical block E | symmetrical block E |
| 011 | symmetrical block D | symmetrical block D |
| 010 | symmetrical block C | symmetrical block C |
| 001 | symmetrical block B | symmetrical block B |
| 000 | symmetrical block A | symmetrical block A |

(The address bits correspond to A18 to A16.)

According to the present example, by decoding an input first address signal by means of an address decoder (not shown), it is possible to select either the boot block section 502 or the boot block section 503.

In that case, the boot block address detection circuit 801 shown in FIG. 3 may be constructed so as to output a High-level output signal when an address signal corresponding to the boot block section 501 and the boot block section 503 placed around the last address is input.

With the memory space 505 having the above-described arrangement, the boot block section 501 and 503 are less likely to subjected to an erase operation than in the comparative memory space 504 shown in FIG. 7A, where the addresses in the boot block section 501 and the boot block section 503 are dispersed over the memory space. Thus, deterioration in the performance can be effectively prevented. Moreover, the memory capacity is not decreased as compared to Example 4 (described below), which again prevents deterioration in the performance.

EXAMPLE 4

FIGS. 8A and 8B each illustrates a memory space of an IC memory card as an example of a semiconductor memory device according to the present invention. More specifically, FIG. 8B shows a memory space 605 of an IC memory card according to Example 4 of the present invention; and FIG. 8A shows a memory space 604 of a comparative IC memory card. Although FIG. 8A and 8B each illustrate the case where the IC memory card includes two boot block flash memories (or boot block sections), the present invention is not limited to such a configuration.

In FIG. 8A, the IC memory card includes a first boot block flash memory 600 and a second boot block flash memory 602. The first boot block flash memory 600 includes a boot block section 601 and symmetrical blocks A, B, and C. The second boot block flash memory 602 includes a boot block section 603 and symmetrical blocks D, E, and F. The memory space 604 of this comparative IC memory card, which includes the first and second boot block flash memories 600 and 602, is arranged so as to include the respective blocks or block sections in the following order, beginning from the first address: the boot block section 601; symmetrical blocks A, B, and C; the boot block section 603; and symmetrical blocks D, E, and F. Thus, it can be seen that the original arrangement of the actual boot block flash memories 600 and 602 is conserved in the memory space 604 shown in FIG. 8A.

In the memory space 605 of the IC memory card according to Example 4 shown in FIG. 8B, the blocks in the boot block flash memories 600 and 602 are arranged in a modified order: symmetrical blocks A, B, C, D, E, and F; and the boot block sections 601 and 603, beginning from the first address.

According to the present example, the boot block sections 601 and 603 are deletion-decoded as shown in FIG. 8B, so that the boot block sections 601 and 603 will not be accessed by a host system.

In general, an IC memory card includes a main memory and an auxiliary memory. A host system can know a status of an IC memory card by accessing the auxiliary memory. For example, in the case where the main memory (flash memory) is composed of 64 kbytes×6=384 kbytes, the host system may access the auxiliary memory to read information that "this card is 384 kbytes in size, and includes no more memory space than that". Based on such information, the host system may access no more than 384 kbytes in the main memory. According to the present example, by storing memory capacity information indicating that the memory capacity has been reduced by the capacity of a boot block section(s) in the auxiliary memory, it is possible to prevent the host system from accessing the boot block section(s).

A relationship between upper addresses input from a host system and decoded blocks according to the present example is shown in Table 2 above. The deletion-decoding by the address decoder 900 in this case may be performed, based on a structure shown in FIG. 9, for example, in accordance with a relationship between the addresses input from the host system and the output signal from the address decoder 900 shown in Table 3:

TABLE 3 truth value table

| address inputs from the host system | | | output from the address decoder | | | |
|---|---|---|---|---|---|---|
| A18 | A17 | A16 | CE0# | CE1# | ZA17 | ZA16 |
| 0 | 0 | 0 | 0 | 1 | 0 | 1 |
| 0 | 0 | 1 | 0 | 1 | 1 | 0 |
| 0 | 1 | 0 | 0 | 1 | 1 | 1 |
| 0 | 1 | 1 | 1 | 0 | 0 | 1 |
| 1 | 0 | 0 | 1 | 0 | 1 | 0 |
| 1 | 0 | 1 | 1 | 0 | 1 | 1 |
| 1 | 1 | 0 | 1 | 1 | * | * |
| 1 | 1 | 1 | 1 | 1 | * | * |

CE0# = A18 + A17 · A16
CE1# = /A18 · /A17 + A17 (A18 + /A16)
ZA17 = A18 + /A17 · /A16 + A17 · /A16
ZA16 = /A18 · /A16 + A18 · A16 + A17

In Table 3, * represents an unspecified value which may be either "0" or "1".

Figure 9:
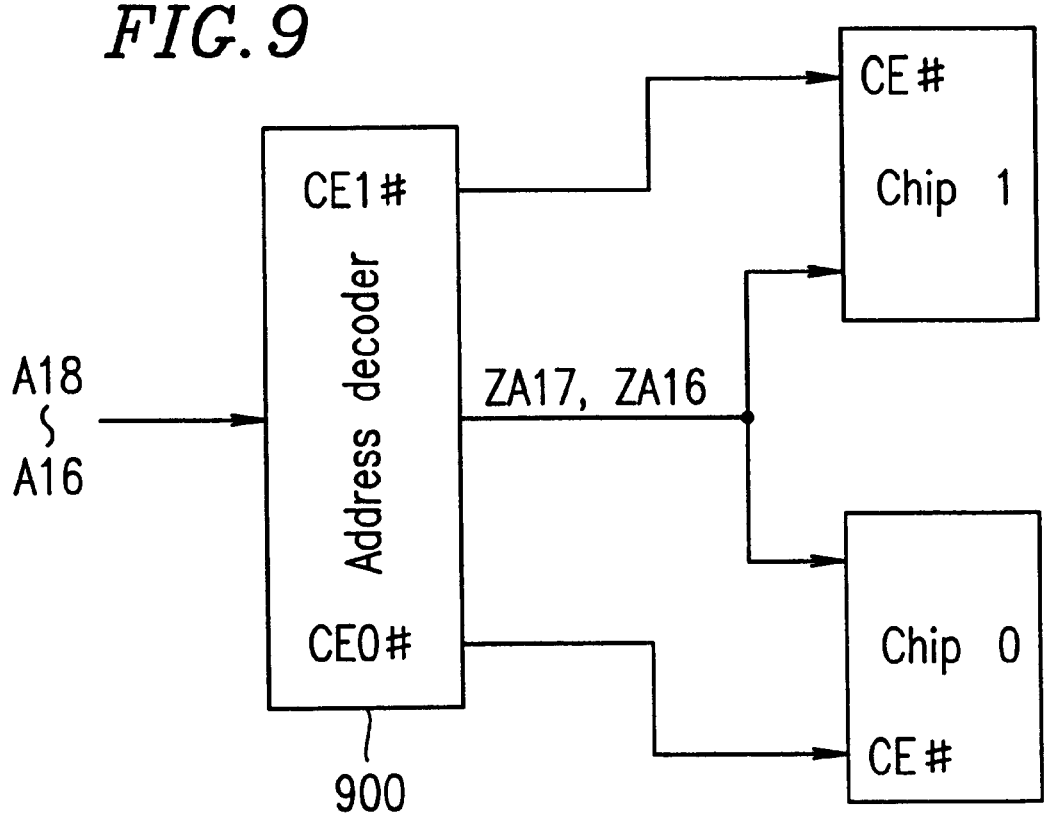
FIG. 9 is a block diagram illustrating the operation of an address decoder in a semiconductor memory device according to Example 4 of the present invention.

In FIG. 9, CE0# and CE1# are Low-active signals. Responsive to addresses input from the host system, the address decoder 900 outputs signals CE0#, CE1#, ZA17 and ZA16 in accordance with the above formulae.

As seen from Table 3, when CE1# and CE1# are both "1", chips 0 and 1 shown in FIG. 9 are both inactive, so that the data stored in the boot block sections cannot be erased (see Table 2), irrespective of the values of addresses A0 to A15 input from the host system. Otherwise, symmetrical blocks A to F are selected as shown in Table 2, in accordance with addresses A16 to A18 input from the host system.

In accordance with the above structure, in which the boot block sections which would require long erase times are not used, there is an advantage in that a shorter wait time is required than in the structure of Example 3, in which the addresses corresponding to the boot block section 601 and the boot block section 603 can be accessed by the host system as shown in FIG. 7B.

EXAMPLE 5

Figure 10:
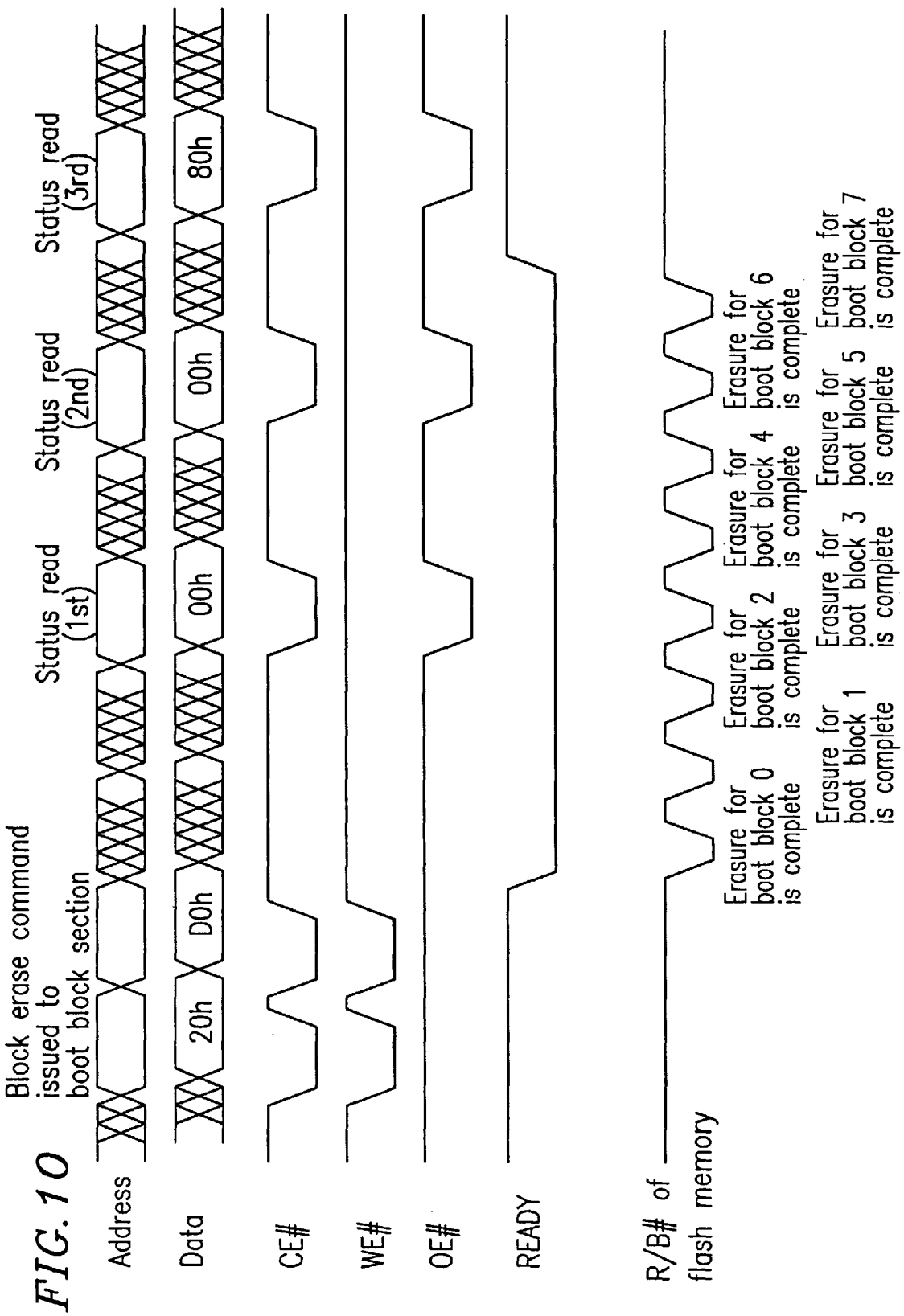
FIG. 10 is a timing diagram illustrating signals used in conjunction with a semiconductor memory device according to Example 5 of the present invention.

FIG. 10 is a timing diagram illustrating signals used in conjunction with a semiconductor memory device according to Example 5 of the present invention.

FIG. 10 shows (from above) a first block designating address signal, the data of a first block erase signal which is decoded and input from the host system 300, CE# (card enable), WE#(write enable), OE#(output enable), READY, and R/B# from the boot block flash memory.

Herein, a case will be described in which, for addresses corresponding to a boot block section in the IC memory card, a first block erase command signal (whose data is "20h" and "D0h") is input from the host system.

The interface IC 302 shown in FIG. 1 receives a first block erase command signal (whose data is "20h" and "D0h") for erasing the data in the boot blocks from the host system, and thereafter performs a data erasure for the boot block section 304 (block 0 to block 7) in the same manner as described in Examples 1 to 4.

Referring back to FIG. 2, when the first block erase command signal is detected by the command detection circuit 802, the READY signal/status signal control circuit 803 drives the READY signal, which is to be output to the host system, to the Low level.

As data erase operations for boot blocks 0 to 7 are sequentially performed, the signal R/B#, which is input from the boot block flash memory to the boot block flash memory control circuit 303 repetitively transitions from L to H to L to H . . . to H. Even in such cases, the READY signal which is sent from the READY signal/status signal control circuit 803 to the host system 300 is maintained at the Low level until the data erasure for block 7 is complete, after which the READY signal is driven to the High level.

Figure 11:
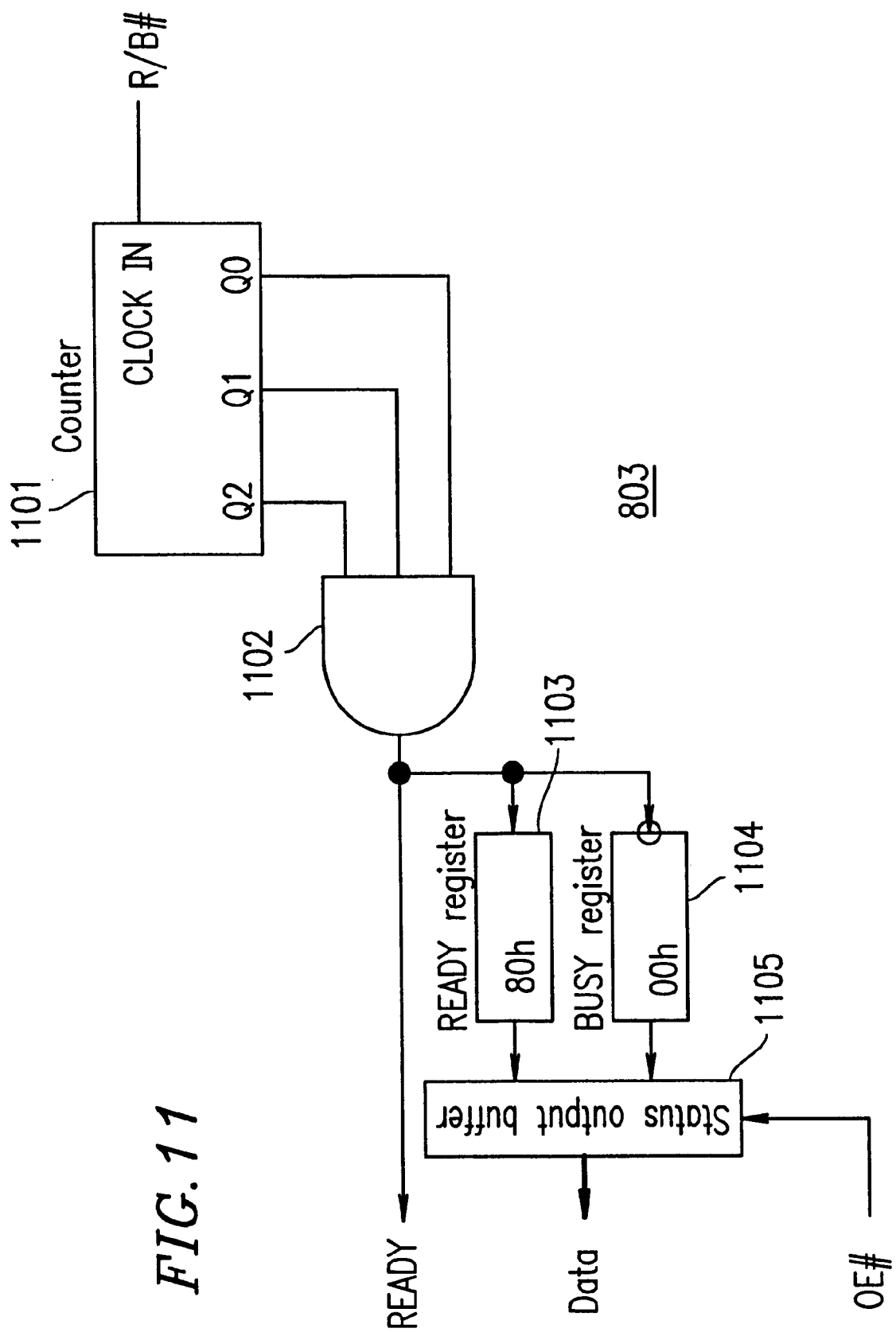
FIG. 11 is a block diagram illustrating an exemplary structure of a READY signal/status signal control circuit in a boot block flash memory control circuit according to an example of the present invention.

FIG. 11 is a block diagram illustrating an exemplary structure of the READY signal/status signal control circuit 803 for performing such an operation.

The READY signal/status signal control circuit 803 shown in FIG. 11 includes a counter 1101, an AND circuit 1102, a READY register 1103, a BUSY register 1104, and a status output buffer 1105.

The counter 1101 outputs signals Q0, Q1, and Q2 to the AND circuit 1102 in accordance with the signal R/B# which is input as a clock signal. Part of the output signal from the AND circuit 1102 is also sent to the host system as the READY signal. The output signal from the AND circuit 1102 is also input to the READY register 1103 and the BUSY register 1104, whose respective output signals are output to the host system 300 via the status output buffer 1105, to which the signal OE# is input. The BUSY register 1104 sends data "00h" indicating that a data erasure for the boot block section is being executed. Moreover, data "80h" indicating that the data erasure for the boot block section has been completed is issued from the READY register 1103.

No matter how many data reads are performed from the READY register 1103 or the BUSY register 1104 in FIG. 11 (e.g., three times as illustrated in FIG. 10), data "00h" is issued as an operation status signal from the READY signal/status signal control circuit 803 (from the BUSY register 1104 and via the status output buffer 1105), until the data erasure for block 7 is complete. Then, during a data read which is performed after the data erasure for block 7 has been complete, data "80h" is issued from the READY register 1103 via the status output buffer 1105.

In accordance with this structure, the data erasure for the boot block section 304 (block 0 to block 7) appears to the host system 300 as if an erase operation for a single symmetrical block (although actually erasing the data in a plurality of boot blocks) in light of both the READY signal and the operation status signal.

In the above description, boot blocks are illustrated merely as specific examples of asymmetrical blocks. Note that boot blocks and parameter blocks differ from each other only with respect to the type of data stored therein. Therefore, it will be appreciated by those skilled in the art that the above description is also applicable to parameter blocks.

As specifically described above, according to the present invention, a number (plurality) of boot blocks can be erased without requiring a plurality of instances of a first block erase command signal to be issued from a host system, thereby reducing the burden on the host system. Moreover, as compared to a conventional structure in which a boot block memory and a symmetrical block memory provided on the same chip are switched, the flash memory can be prevented from having an increased chip area. As a result, an increase in the cost for producing an IC memory card associated with providing both a boot block memory and a symmetrical block memory on the same chip can be prevented.

Furthermore, since the size of the boot blocks to be erased can be equalized to the capacity of a symmetrical block, it is possible to allow a boot block section (including a number of boot blocks) to operate as a symmetrical block. Accordingly, operations on an IC memory card including boot blocks can properly take place by employing a host system containing software which is designed for IC memory cards of a symmetrical block flash memory type.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A boot block flash memory control circuit for controlling a boot block flash memory, the boot block flash memory comprising at least one symmetrical block each having a first capacity and a plurality of asymmetrical blocks each having a capacity smaller than the first capacity, wherein:

the plurality of asymmetrical blocks is divided into at least one virtual block, each of the at least one virtual block being comprised of a plural number of asymmetrical block;

the boot block flash memory control circuit detects a first address signal designating an address in the boot block flash memory and a first command signal for causing the boot block flash memory to operate, and based on the detected first address signal and first command signal, outputs a second command signal and a second address signal for erasing data stored in one of the at least the one symmetrical block or the at least one virtual block, and when erasing data stored in each of the at least one virtual block, the second address signal is counted so as to address each asymmetrical block comprising the virtual block.

2. A boot block flash memory control circuit according to claim 1, wherein a total capacity of each of the at least one virtual block is equal to the first capacity of the at least one symmetrical block.

3. A boot block flash memory control circuit according to claim 1, wherein while data stored in one of the at least one virtual block is erased, a READY signal and an operation status signal, which are similar to a READY signal and an operation status signal to be output when data stored in one of the at least one symmetrical block is erased, are output.

4. A boot block flash memory control circuit according to claim 1, further comprising:
- a boot block address detection circuit for detecting a first block designating address signal which designates one of the at least one virtual block and outputting a first signal based on the first block designating address signal;
- a command detection circuit for outputting a second signal based on the first signal, a first block erase command signal for erasing data stored in one of the at least one virtual block, and a first control signal; and
- an address/command generation circuit for outputting the second address signal and the second command signal to one of the at least one virtual block based on the second signal and a second control signal from the boot block flash memory.

5. A boot block flash memory control circuit according to claim 3, further comprising a READY signal/status signal control circuit for outputting a signal indicating an erasure state while one of the at least one virtual block is erased.

6. A boot block flash memory control circuit according to claim 1, wherein at least one of the plurality of asymmetrical blocks comprises a boot block or a parameter block.

7. An IC memory card comprising:
- a boot block flash memory; and
- an interface IC for controlling the boot block flash memory based on an external signal,
- wherein the interface IC comprises the boot block flash memory control circuit according to claim 1.

8. An IC memory card according to claim 7, wherein in a memory space of the boot block flash memory, a plurality of asymmetrical blocks comprised in the boot block flash memory are decoded to an address region which is substantially unlikely to be accessed.

9. An IC memory card according to claim 7, wherein in a memory space of the boot block flash memory, a plurality of asymmetrical blocks comprised in the boot block flash memory are decoded so as to be deleted from the memory space.

10. A semiconductor memory device comprising: a host system;
- a boot block flash memory; and
- a boot block flash memory control circuit for controlling the boot block flash memory based on a signal from the host system,
- wherein the boot block flash memory control circuit comprises the boot block flash memory control circuit according to claim 1.

11. A method for erasing data stored in a boot block flash memory comprising a plurality of asymmetrical blocks, comprising the steps of:
- outputting a first signal based on a first block designating address signal which indicates a block designating address of a subset of the plurality of asymmetrical blocks input from the host system;
- outputting a second signal based on the first signal, a first block erase command signal, and a first control signal;
- outputting a second block designating address signal and a second block erase command signal to the boot block flash memory, based on the second signal and a second control signal from the boot block flash memory;
- counting the second block designating address signal so as to address each asymmetrical block in the subset of the plurality of asymmetrical blocks; and
- outputting to the host system a signal indicating an erasure state of the boot block flash memory while erasing data stored in a subset of a plurality of asymmetrical blocks comprised in the boot block flash memory.

12. A method according to claim 11, wherein the plurality of asymmetrical blocks are decoded in such a manner that erasure of data stored in the plurality of asymmetrical blocks is prohibited irrespective of the first block designating address signal which is input from the host system.

* * * * *